(12) United States Patent
Wevers et al.

(10) Patent No.: US 8,831,170 B2
(45) Date of Patent: Sep. 9, 2014

(54) MIRROR WITH A MIRROR CARRIER AND PROJECTION EXPOSURE APPARATUS

(75) Inventors: Rutger Wevers, Aachen (DE); Andreas Seifert, Aalen (DE); Joachim Hartjes, Aalen (DE); Guenther Dengel, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1829 days.

(21) Appl. No.: 11/934,509

(22) Filed: Nov. 2, 2007

(65) Prior Publication Data

US 2008/0144202 A1 Jun. 19, 2008

(30) Foreign Application Priority Data

Nov. 3, 2006 (DE) .......................... 10 2006 052 265

(51) Int. Cl.
*G02B 5/08* (2006.01)
*G02B 7/195* (2006.01)
*G02B 17/06* (2006.01)
*G03F 7/20* (2006.01)

(52) U.S. Cl.
CPC ............ *G02B 17/0657* (2013.01); *G02B 7/195* (2013.01); *G03F 7/70891* (2013.01)
USPC ............................................. 378/34; 359/845

(58) Field of Classification Search
USPC .............. 359/832, 845, 850–851; 378/34–35; 101/450.1–473; 430/302–305
See application file for complete search history.

(56) References Cited

U.S. PATENT DOCUMENTS

| 3,637,296 | A | 1/1972 | McLafferty et al. |
| 3,731,992 | A | 5/1973 | Mansell |
| 3,781,094 | A | 12/1973 | Griest |
| 4,264,146 | A | 4/1981 | Sutton |
| 5,073,831 | A | 12/1991 | Flint |
| 6,353,470 | B1 | 3/2002 | Dinger |
| 2005/0099611 | A1* | 5/2005 | Sogard ............................ 355/30 |
| 2006/0227826 | A1* | 10/2006 | Balogh et al. ................... 372/34 |

FOREIGN PATENT DOCUMENTS

| DE | 33 39 076 | 5/1982 |
| DE | 41 11 554 | 10/1992 |
| DE | 103 60 414 | 7/2005 |
| EP | 1 376 185 | 1/2004 |
| JP | 2004-095993 | 3/2004 |
| WO | WO 2005/054547 | 6/2005 |

OTHER PUBLICATIONS

'Solder' 2005, in the Crystal Reference Encyclopedia, Crystal Semantics, West Chiltington, West Sussex, Uniked Kingdom, viewed Jul. 30, 2010 (from http://www.credoreference.com/entry/cre/solder>.*

* cited by examiner

*Primary Examiner* — J Doak
(74) *Attorney, Agent, or Firm* — Fish & Richardson P.C.

(57) ABSTRACT

A mirror with a mirror carrier, as well as related apparatuses, systems and methods are disclosed. The mirror carrier can be embodied as cooling device with at least one cooling channel. Tube connections can be provided to connecting the at least one cooling channel to an inlet and an outlet of coolant. Sealing elements for a gas-tight and liquid-tight seals can be arranged between the tube connections and the mirror carrier. The field of application of the mirror can be, for example, an illumination device of a projection exposure apparatus.

31 Claims, 3 Drawing Sheets

MIRROR WITH A MIRROR CARRIER AND PROJECTION EXPOSURE APPARATUS

CROSS-REFERENCE TO RELATED APPLICATION

This application claims priority under 35 U.S.C. §119 to German patent application serial number 10 2006 052 265.6, filed Nov. 3, 2003.

FIELD

The disclosure relates to a mirror with a mirror carrier, and to related apparatuses, systems and methods.

BACKGROUND

Microlithography projection exposure apparatuses are known. In some instances, the projection light has a wavelength in the extreme ultraviolet spectral range (EUV). In such instances, mirrors are commonly used.

SUMMARY

In one aspect, the disclosure features an apparatus that includes a mirror, tube connections and sealing elements. The mirror carrier has at least one cooling channel, and the mirror carrier includes a crystalline material. The tube connections include a metallic material, and the tube connections are configured to be capable of connecting the at least one cooling channel to an inlet and an outlet of coolant. Each of the tube connections has an external thread screwed into a corresponding thread hole in the mirror carrier. The sealing elements are configured to be capable of providing a gas-tight and liquid-tight seal, and the sealing elements are arranged between the tube connections and the mirror carrier.

In another aspect, the disclosure features an apparatus that includes a light source and a projection objective configured to be used in EUV lithography. The projection objective includes mirrors, a mirror carrier configured to be used with one of the mirrors, tube connections and sealing elements. The mirror carrier is configured as a cooling device with at least one cooling channel. The tube connections are configured to be capable of connecting the at least one cooling channel to an inlet and an outlet of coolant. The sealing elements are configured to be capable of providing a gas-tight and liquid-tight seal between the tube connections and the mirror carrier. The apparatus is a projection exposure apparatus.

In a further aspect, the disclosure features an apparatus that includes non-metallic mirror carrier and a metallic connecting element. The non-metallic mirror carrier includes at least one thread, and the metallic connecting element engages into the thread via a counterthread. The thread and/or the counterthread is coated with a soft metal.

In an additional aspect, the disclosure features an apparatus that includes a mirror carrier, tube connections and solder. The mirror carrier has at least one cooling channel, and the tube connections include a metallic material configured to be capable of connecting the at least one cooling channel to an inlet and an outlet of coolant. The solder has a low melting point, and the solder connects the tube connections to the mirror carrier.

In another aspect, the disclosure features an apparatus that includes a mirror carrier and tube connections. The mirror carrier has at least one cooling channel, and the tube connections include a metallic material configured to be capable of connecting the at least one cooling channel to an inlet and an outlet of coolant. The tube connections are surrounded by cutouts for stress relief at least in regions in the vicinity of their peripheries.

In a further aspect, the disclosure features an apparatus that includes a mirror carrier and tube connections. The mirror carrier has at least one cooling channel, and the tube connections include a metallic material configured to be capable of connecting the at least one cooling channel to an inlet and an outlet of coolant. At least one part of a tube connections projects into the mirror carrier and has a mechanism for stress relief.

In an additional aspect, the disclosure features an apparatus that includes a mirror configured to be used in an EUV projection exposure apparatus. The apparatus also includes a non-metallic mirror carrier with at least one cooling channel, where the non-metallic mirror carrier includes a first material. The apparatus further includes a tube connection that includes a second material different from the first material. The tube connection is connected to the non-metallic mirror carrier via a connection that is high-vacuum-tight and radiation-resistant to light in the wavelength range of from 1 nm to 100 nm.

The present disclosure can provide a mirror (e.g., for a projection exposure apparatus in the EUV range) in which a cooling of the mirror can be achieved in a relatively simple manner, wherein, in spite of the particular characteristics in this optical field, in particular of the materials used, a reliable connecting technique is provided which reliably prevents cooling medium or else gases and substances present in the cooling medium from being able to escape into the surroundings of the mirror, in particular into the interior of an illumination device or a projection objective of a projection exposure apparatus and thereby being able to impair the purity and/or the vacuum.

In some embodiments, a mirror with a mirror carrier is configured in such a way that the mirror carrier is embodied as cooling device with at least one cooling channel, wherein the mirror carrier is provided with tube connections to connect the at least one cooling channel to an inlet and an outlet of coolant, and wherein sealing elements for a gas- and liquid-tight sealing are arranged between the tube connections and the mirror carrier.

In certain embodiments, a projection exposure apparatus includes a light source (e.g., as a component of an illumination device) and a projection objective that includes mirrors which are provided with mirror carriers and with mirror surfaces. The mirrors and mirror carriers are configured in such a way that at least one mirror carrier of one mirror is embodied as cooling device with at least one cooling channel, wherein the mirror carrier is provided with tube connections for connecting the at least one cooling channel to an inlet and an outlet of coolant and wherein sealing elements for a gas- and liquid-tight sealing are arranged between the tube connections and the mirror carrier.

In some embodiments, a cooling of the mirror to a desired extent can be achieved in a simple manner and primarily in a direct contact. As an example, a mirror carrier and cooling device constitute one unit. High thermal loads on the surface to be cooled, namely the mirror surface, can be dissipated in this way.

In certain embodiments, it is desirable to ensure that a good and optionally permanent connection is provided between the tube connections and the mirror carrier. The sealing elements can, for example, result in a gas- and liquid-tight sealing with respect to the region surrounding the mirror, such that there is no contamination in the region or space. This can be particularly desirable in the case of EUV lithography, wherein mirror carriers are usually composed of crystalline material (e.g., glass) and sealing and connecting problems can correspondingly occur between the mirror carrier and the tube connections, which are generally composed of a metallic material.

In certain embodiments, the tube connections are provided with respective external threads which are screwed into the mirror carrier in corresponding threaded holes. The external threads of the tube connections can include (e.g., be coated with) a material that is softer than the material of the tube connections. This can reduce (e.g., eliminate) high point loads, while optionally achieving a reliable seal at the same time. In some embodiments, the internal threads in the threaded holes of the mirror carriers may be ground. Materials that can be as a coating include gold, silver and indium. Such materials which are resistant in the EUV range.

In some embodiments, the tube connections are provided with flanges, in which are arranged at least two sealing rings arranged at a distance from one another. In this case, sealing rings should be used (e.g., O-rings) which are correspondingly resistant for the region used.

In certain embodiments, a venting ring channel is arranged between the two sealing rings. A cooling medium that possibly escapes from the cooling channel in liquid or else gaseous form or else other substances present in the cooling medium can be conducted away via the venting ring channel without contamination of the region surrounding the mirror occurring. The venting ring channel can be provided with at least one venting hole connected to an extraction device (e.g., to a vacuum pump).

BRIEF DESCRIPTION OF THE FIGURES

In the figures.

DETAILED DESCRIPTION

Figure 1:
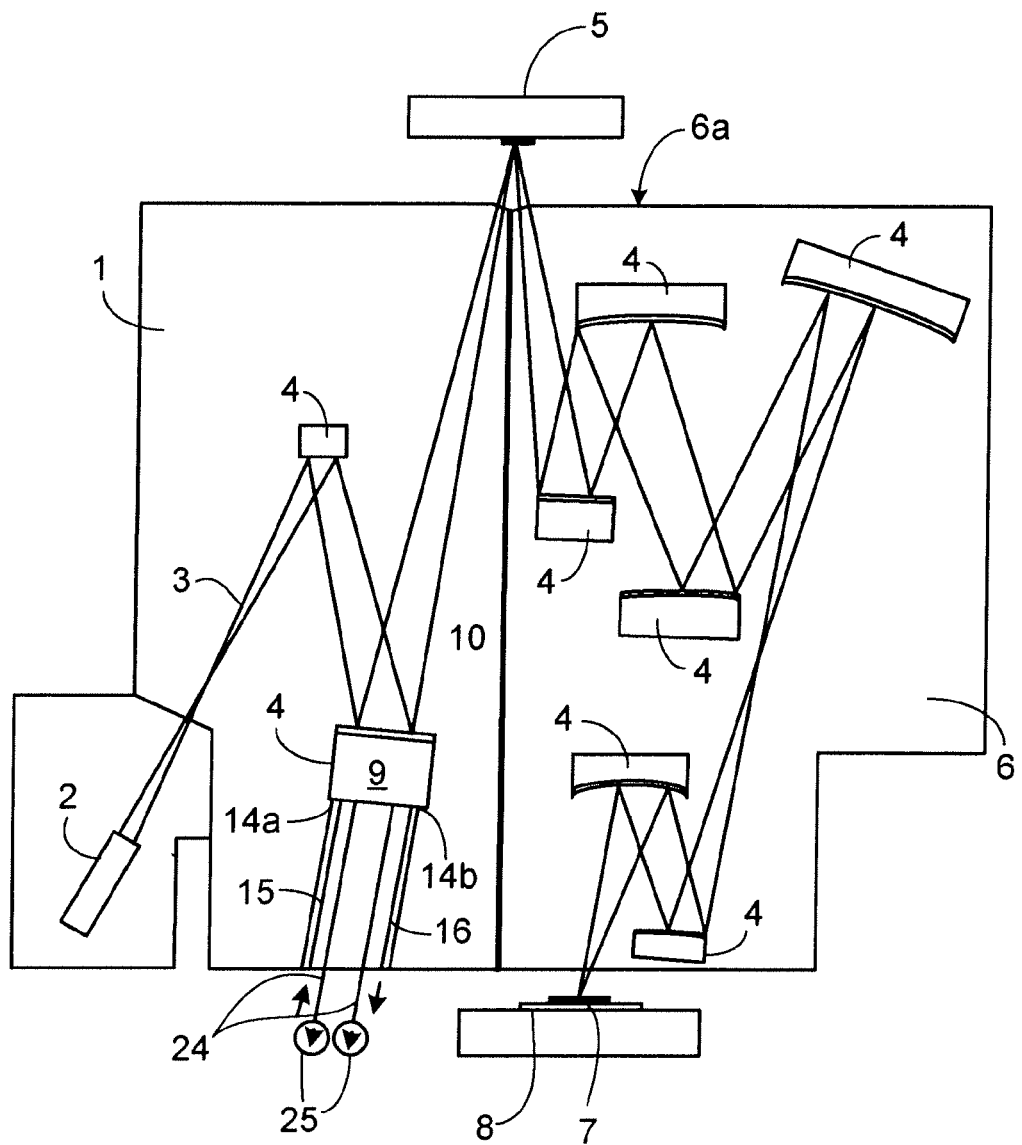
FIG. 1 is a schematic illustration of a projection exposure apparatus.

FIG. 1 illustrates a microlithographic projection exposure apparatus in a highly schematic section that is not to scale. The projection exposure apparatus includes an illumination device 1 with a light source 2. The light source 2 can generate projection light 3 working in the extreme ultraviolet spectral range with a wavelength of 13.5 nm, for example. Arranged in the illumination device 1 are various optical devices, which include mirrors 4 that send the projection light 3 onto a reticle 5. The projection light 3 reflected from the reticle 5 enters into a projection objective 6, in which are arranged various optical devices, which here as well include mirrors 4 and which are arranged in a projection housing 6a in the same way as the optical devices in the illumination device 1. After multiple reflections at the mirrors 4, the projection light 3 impinges on a light-sensitive layer 7 applied on a silicon wafer 8, and generates on the layer a demagnified image of the structure contained in the reticle 5.

Projection exposure apparatus including illumination devices and projection objectives are general prior art, which is why they are not discussed in any greater detail here. By way of example, in this respect reference is made to DE 103 60 414 A1 and U.S. Pat. No. 6,353,470 B1, which therefore also form the disclosure content of the present application.

Each mirror 4 has a mirror carrier 9, which is provided with a coating as mirror surface 10 on one side. The coatings of the mirror surfaces 10 can differ from mirror to mirror; a monolithic embodiment of the mirror surface 10 is also conceivable.

Figure 2:
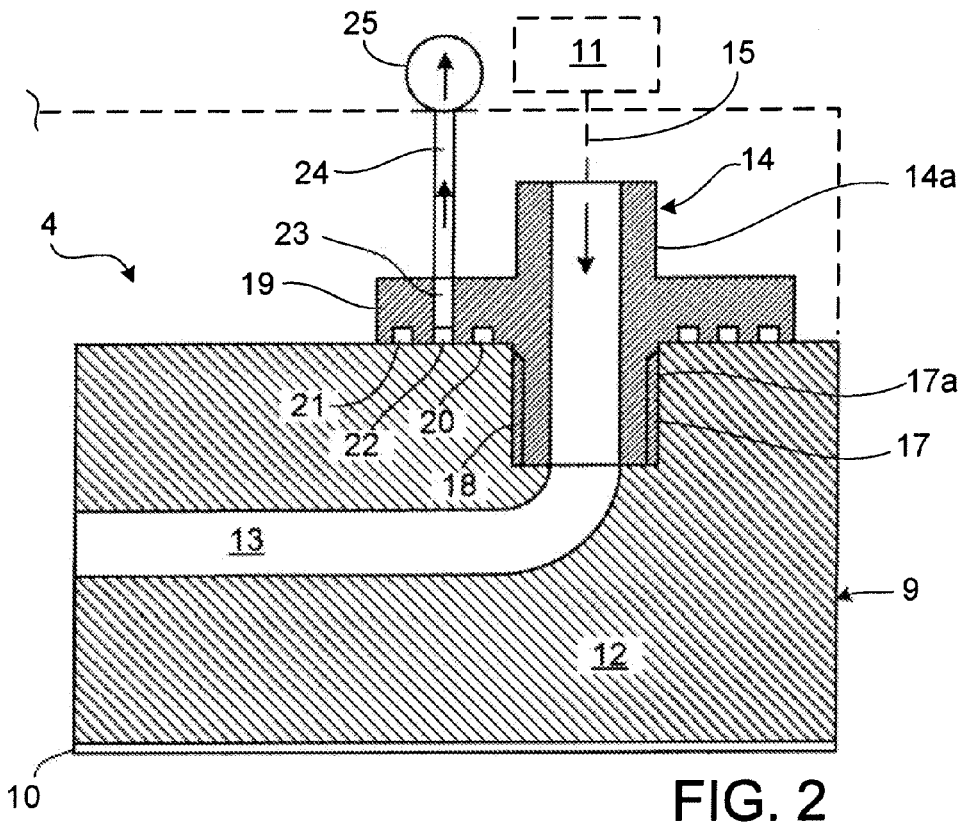
FIG. 2 is an enlarged illustration of a mirror.
Figure 3:
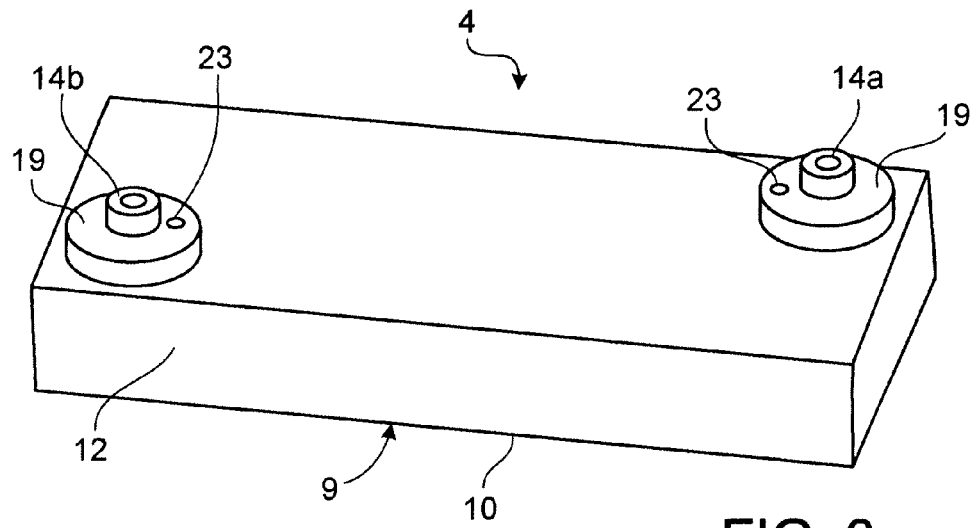
FIG. 3 is a perspective illustration of a mirror.

FIGS. 2 and 3 illustrate a mirror 4 such as may be formed in the illumination device 1, for example, in which a high-purity gas atmosphere or even vacuum is present. For a highly accurate imaging of the projection light 3, the mirror 4 should be kept at a temperature that is as exact as possible, the difficulty consisting, inter alia, in that heating occurs as a result of the projection light 3. For this reason, the mirrors 4 have to be cooled and, for this purpose are connected to a cooling system 11.

As can be seen from the partial enlargement in the sectional view of FIG. 2, the mirror carrier 9 includes a cooling device, or a cooling device 12 is integrated into the mirror carrier 9. For this purpose, the mirror carrier 9 is provided with one or more cooling channels 13. The cooling channel or cooling channels 13 is or are provided with tube connections 14, namely for a coolant inlet connection 14a and a coolant return connection 14b (see FIG. 1). The coolant inlet connection 14a is connected to the cooling system 11 via a coolant line 15. The coolant is conducted back from the coolant return connection 14b to the cooling system 11 via a coolant line 16, which is only illustrated in its basic principle in FIG. 1. The tube connections 14 for the coolant lines 15 and 16 are connected to the mirror carrier 9 in any desired manner. In the present case, this is done using an external thread 17 on the respective tube connection, which is screwed into the mirror carrier 9 into a threaded hole 18 having an internal thread. In this case, the internal thread merges into the cooling channel 13.

In the case of projection exposure apparatuses of the type previously described, the mirror carrier 9 is generally composed of a non-metallic material such as a glass, a glass ceramic or ULE, wherein crystalline portions e.g. composed of a semiconductor material, in particular silicon, may be present. Since the tube connections 14 are generally composed of a metallic material such as copper, steel, in particular Invar steel, or aluminium, precautions should correspondingly be taken to ensure an entirely satisfactory and a very precise sealing. For this purpose the external thread 17 of the tube connection 14 is coated with a soft material 17a, in particular a soft metal such as e.g. silver, copper, gold or indium; a corresponding coating of the internal thread in the threaded hole 18 of the mirror carrier 9 is also conceivable.

In order to afford a high security against contamination of the interior of the projection housing 6a in the illumination device 1 or the projection objective 6 by escaping coolant or by gases present in the coolant, additional sealing measures should be provided. This holds true in particular for the region of a flange 19 of a tube connection 14. At least two sealing rings 20 and 21 which are arranged at a distance from one another, which run in ring form between the flanges 19 and the mirror carrier 9 and which are arranged in ring-shaped cutouts in the flange 19 serve as a first measure for this purpose. Generally known O-rings can be used as sealing rings 20 and 21, but care should be taken to ensure that they must be resistant to the radiation from the light source 2.

As a further sealing measure, a venting ring channel 22 is arranged between the two sealing rings 20 and 21 and is connected to an extraction device 25 via a venting hole 23 with an adjacent venting line 24. Gases or else coolant possibly still escaping via the sealing ring 20 can be conducted away via the venting ring channel 22, the venting hole 23 and the venting line 24 in such a way that no contamination occurs in the interior of the projection exposure apparatus (e.g., in the illumination device 1). For this purpose, it is merely necessary for the extraction device 25 to be arranged outside the projection housing 6a and for the venting line 24 to be led through the interior.

The cooling device 12 integrated into the mirror carrier 9 provides a simple cooling with a simple mechanical connecting technique and thus solves the problem occurring when crystalline mirror carriers are used, particularly with regard to a good cooling and a vacuum-suitable sealing with respect to both liquid and gaseous substances. Mirror carrier 9 and cooling systems 12 represent an integral unit or they are produced as a monolith.

The metallic tube connection 14 can also be connected to the material of the mirror carrier 9 via low temperature soldering. "Low temperature soldering" should be understood to mean soldering using a solder having a low melting point (e.g., less than 150° C.). In order to increase the solderability of the partners to be joined, the material of the mirror carrier 9 can be coated with a readily solderable metal such as e.g. Ni in the region of the connecting location. Other metals such as Cu, Ag or Au are likewise suitable for this purpose.

Figure 4:
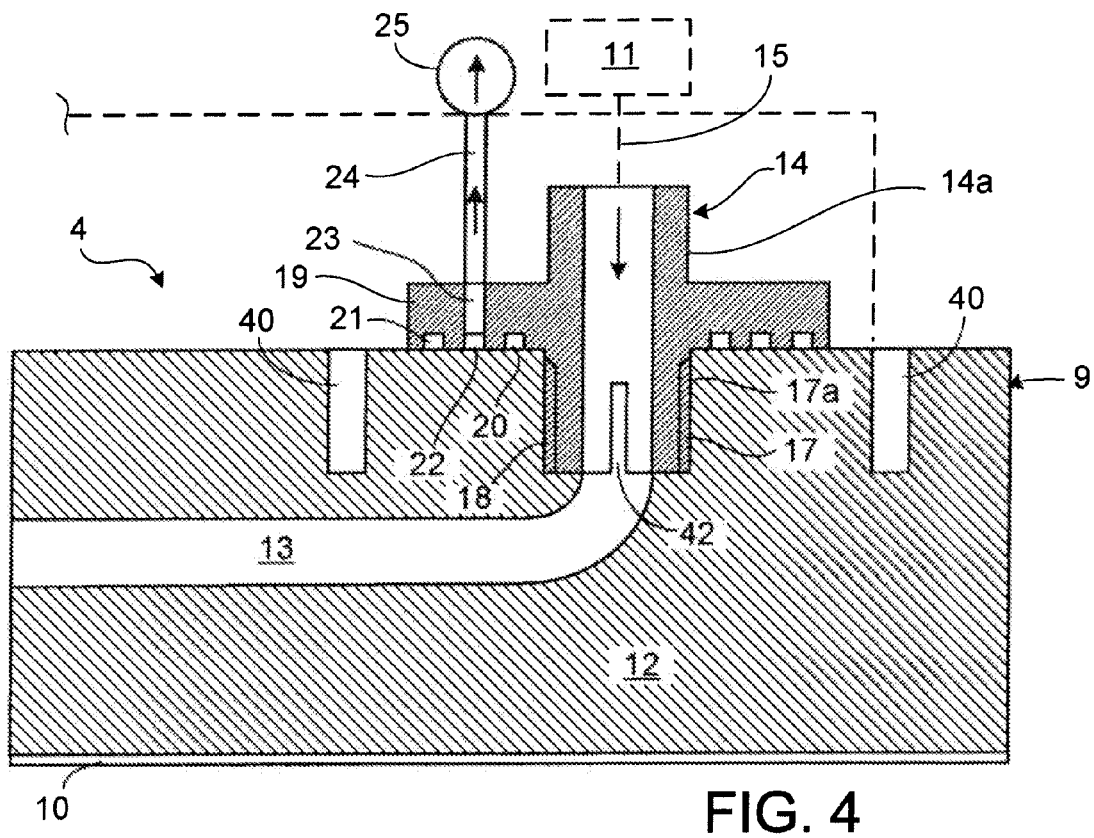
FIG. 4 is an illustration of a mirror.

FIG. 4 shows one possibility for reducing the transmission of the mechanical stresses that arise when connecting the mirror carrier 9 to the tube connections 14 into the mirror carrier 9. FIG. 4 illustrates, as in FIG. 2, a mirror 4 with a mirror carrier 9, which is provided with at least one mirror surface 10. In this case, as already explained, the mirror carrier 9 is embodied as cooling device 12 with at least one cooling channel 13 and the mirror carrier 9 is provided with tube connections 14 composed of a metallic material for connecting the at least one cooling channel 13 to an inlet and an outlet 15, 16 of coolant. In this case, the tube connections 14 are surrounded by cutouts 40 for stress relief at least in regions in the vicinity of their peripheries. The cutouts may have e.g. a depth which exceeds ⅓ of the thread depth in the case of a screw connection and may amount to up to 1.5 times the thread depth. In the cases where the tube connections 14 are soldered e.g. at their peripheral region, the depth of the cutouts or stress relief grooves 40 depends on the precise configuration of tube connection 14 and on the configuration of the mirror carrier 9, that is to say in particular also on how far away from the soldering connection is that part of the mirror surface 10 which is subjected to the optical useful radiation, and the material of which the mirror carrier 9 is composed.

Figure 5:
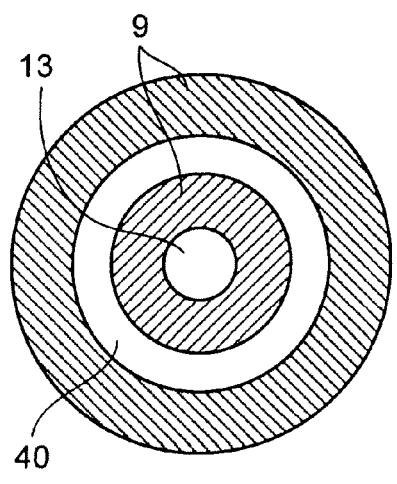
FIG. 5 is a plan view of the mirror illustrated in FIG. 4.
Figure 6:
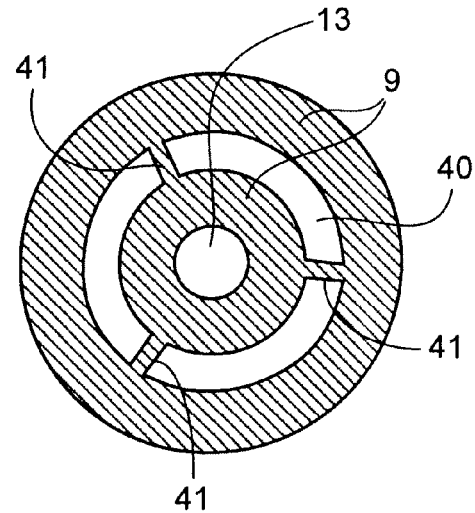
FIG. 6 is a plan view of a modification of the mirror illustrated in FIG. 4.

FIGS. 5 and 6 illustrate the cutouts 40 described above in a plan view. In this case, the cutout 40 surrounds the exit region of the cooling channel 13 from the mirror carrier 9. The variant illustrated in FIG. 6 furthermore shows stiffening ribs 41 that increase the stability of the structure. Particularly in the cases where the tube connections 14 are soldered onto the mirror carrier 9 in planar fashion, the width of the cutouts 40 will be a fraction of the diameter of the tube connection 14. Values of between 0.1 and 0.5 of the diameter can be used in this case. It is furthermore conceivable that in the case of the soldering connection, too, a pin analogously to the illustration in FIG. 2 projects into the mirror carrier 9 in order to obtain e.g. a centring during soldering.

As an alternative or in addition, it is also possible for at least one part of a tube connection 14 which projects in the mirror carrier 9 to have a mechanism for stress relief 42 by virtue of being embodied in slotted fashion, for example, as is the case e.g. with clamping pinchers (with the opposite intention in that case). The number of slots (which then interrupt at least part of the thread in the case of the screw variant) may be between 1 and 10 depending on the diameter of the thread of the tube connection 14. This possibility is likewise illustrated in FIG. 4; the aforementioned slots are designated by 42.

The features described above can also be combined, of course. Thus, e.g. a screwed-in tube connection 14, for sealing purposes, can additionally be soldered at the periphery of its flange edge in order to ensure a vacuum-tightness over a long time, sealing of this type being very robust in withstanding the short-wave radiation occurring under EUV conditions. In this case, the mechanical loads are essentially taken up via the screw connection. In the last-mentioned embodiment, possible stress relief cutouts depend on the above-specified depth of the screw connection.

The configuration described above is suitable for a series production and the cooling device enables even high thermal loads to be dissipated. Furthermore, the measures illustrated afford the possibility of realizing vacuum-suitable connections, which constitutes a particular advantage for an application in systems appertaining to EUV lithography.

In other words, it is possible to realize mirrors of an EUV projection exposure apparatus with a first non-metallic mirror carrier with at least one cooling channel, wherein the cooling channel has a connection to a tube connection composed of a second material, which differs from the material of the mirror carrier, and wherein the connection is high-vacuum-tight and radiation-resistant to light in the wavelength range of 1 nm to 100 nm.

This can be achieved by all the above-described variants. In particular the second material may be Invar steel or a metal alloy. Furthermore, the second material may also be a non-metal, such that, by way of example, a Zerodur mirror carrier can also be provided with a quartz or Si or ceramic tube connection if matching of the coefficients of expansion requires this for further mechanical stress relief. In this case, both a screw joint and a soldered joint can be effected. In the case of the latter, not only the mirror carrier but also part of the non-metallic tube connection must then be coated with a metal. In this case, the second material is chosen such that, at the operating temperature of the connecting location, it has less brittleness than the first non-metallic mirror material.

It goes without saying that the cooling device described above can be used not only for crystalline mirrors, but also for other optical devices, such as lenses, for example, in which the same problems occur and in which a thermal and mechanical stability and an EUV suitability must likewise be present.

What is claimed is:

1. An apparatus, comprising:
   a mirror carrier having at least one cooling channel, the mirror carrier comprising a crystalline material;
   a tube connection comprising a metallic material, the tube connection being configured to be capable of connecting the at least one cooling channel to an inlet of coolant or an outlet of coolant, and the tube connection having an external thread screwed into a corresponding thread hole in the mirror carrier; and
   a sealing element configured to be capable of providing a gas-tight and liquid-tight seal, the sealing element being arranged between the tube connection and the mirror carrier.

2. The apparatus according to claim 1, wherein the external threads of the tube connection comprise a material that is softer than the material of the tube connections.

3. The apparatus according to claim 1, wherein the tube connection has a flange and at least two sealing rings that are arranged at a distance from one another in the flange.

4. The apparatus according to claim 3, wherein a venting ring channel is arranged between the two sealing rings.

5. An apparatus, comprising:
a light source; and
a projection objective configured to be used in EUV lithography, the projection objective comprising:
mirrors,
a mirror carrier configured to be used with one of the mirrors;
first and second tube connections; and
first and second sealing elements,
wherein:
the mirror carrier is configured as a cooling device with at least one cooling channel;
the first tube connection is configured to be capable of connecting the at least one cooling channel to an inlet of coolant;
the second tube connection is configured to be capable of connection the at least one cooling channel to an outlet of coolant;
the first sealing element is configured to be capable of providing a gas-tight and liquid-tight seal between the first tube connection and the mirror carrier;
the second sealing element is configured to be capable of providing a gas-tight and liquid-tight seal between the second tube connection and the mirror carrier; and
the apparatus is a projection exposure apparatus.

6. The apparatus according to claim 5, wherein the mirror carrier comprises crystalline material, and the first and second tube connections comprise a metallic material.

7. The apparatus according to claim 5, wherein the first and second tube connections each has an external thread screwed into a corresponding threaded hole in the mirror carrier.

8. The apparatus according to claim 7, wherein the external threads of the first tube connection comprises a material that is softer than the material of the first tube connection.

9. The apparatus according to claim 8, wherein the soft material comprises a material selected from the group consisting of gold, indium and silver.

10. The apparatus according to claim 5, wherein:
the first tube connection has a flange and at least two sealing rings arranged at a distance from one another in the flange of the first tube connection; and
the second tube connection has a flange and at least two sealing rings arranged at a distance from one another in the flange of the second tube connection.

11. The apparatus according to claim 10, wherein a venting ring channel is arranged between the two sealing rings of the first tube connection.

12. The apparatus according to claim 11, wherein the venting ring channel is provided with at least one venting hole.

13. The apparatus according to claim 12, further comprising an extraction device, wherein the at least one venting hole is connected to the extraction device.

14. An apparatus, comprising:
a non-metallic mirror carrier having at least one thread; and
a metallic connecting element that engages into the at least one thread via a counterthread,
wherein at least the thread or the counterthread is coated with a soft metal.

15. The apparatus according to claim 14, wherein the mirror carrier comprises a crystalline material.

16. The apparatus according to claim 14, wherein the mirror carrier has a monolithically formed mirror surface.

17. The apparatus according to claim 14, wherein the thread merges into a cooling channel.

18. The apparatus according to claim 14, wherein the non-metallic mirror carrier comprises a material selected from the group consisting of a glass, a glass ceramic and ULE.

19. The apparatus according to claim 15, wherein the crystalline material is a semiconductor material.

20. The apparatus according to claim 14, wherein the metallic connecting element comprises a material selected from the group consisting of copper, steel, and aluminium.

21. The apparatus according to claim 14, wherein the soft metal comprises a metal selected form the group consisting of copper and indium.

22. An apparatus, comprising:
a mirror carrier with at least one cooling channel;
a tube connection comprising a metallic material configured to be capable of connecting the at least one cooling channel to an inlet of coolant or an outlet of coolant; and
solder having a low melting point, the solder connecting the first tube connection to the mirror carrier.

23. An apparatus, comprising:
a mirror carrier with at least one cooling channel; and
a tube connection configured to be capable of connecting the at least one cooling channel to an inlet of coolant or an outlet of coolant, the tube connection being surrounded by cutouts for stress relief at least in regions in the vicinity of its periphery.

24. An apparatus, comprising:
a mirror carrier with at least one cooling channel; and
a tube connection configured to be capable of connecting the at least one cooling channel to an inlet of coolant or an outlet of coolant, at least one part of the tube connection projecting into the mirror carrier and having a mechanism for stress relief.

25. An apparatus, comprising:
a mirror configured to be used in an EUV projection exposure apparatus;
a non-metallic mirror carrier with at least one cooling channel, the non-metallic mirror carrier comprising a first material;
a tube connection comprising a second material different from the first material,
wherein the tube connection is connected to the non-metallic mirror carrier via a connection that is high-vacuum-tight and radiation-resistant to light in the wavelength range of from 1 nm to 100 nm.

26. The apparatus of claim 1, further comprising a mirror, wherein the mirror carrier carries the mirror.

27. The apparatus of claim 14, further comprising a mirror, wherein the mirror carrier carries the mirror.

28. The apparatus of claim 22, further comprising a mirror, wherein the mirror carrier carries the mirror.

29. The apparatus of claim 23, further comprising a mirror, wherein the mirror carrier carries the mirror.

30. The apparatus of claim 24, further comprising a mirror, wherein the mirror carrier carries the mirror.

31. The apparatus of claim 25, further comprising a mirror, wherein the mirror carrier carries the mirror.

* * * * *

UNITED STATES PATENT AND TRADEMARK OFFICE
CERTIFICATE OF CORRECTION

| | |
|---|---|
| PATENT NO. | : 8,831,170 B2 |
| APPLICATION NO. | : 11/934509 |
| DATED | : September 9, 2014 |
| INVENTOR(S) | : Rutger Wevers et al. |

Page 1 of 1

It is certified that error appears in the above-identified patent and that said Letters Patent is hereby corrected as shown below:

Title Page, col. 2, "OTHER PUBLICATIONS", line 2, delete "Uniked" and insert -- United --.

In the Specification,

Col. 1, line 9, delete "Nov. 3, 2003." and insert -- Nov. 3, 2006. --.

In the Claims,

Col. 8, line 14, delete "form" and insert -- from --.

Signed and Sealed this
Sixth Day of January, 2015

Michelle K. Lee
*Deputy Director of the United States Patent and Trademark Office*